United States Patent [19]
Nagashima

[11] Patent Number: 5,931,002
[45] Date of Patent: Aug. 3, 1999

[54] COOLING AIR DUCT AND COOLING APPARATUS

[75] Inventor: Tetsuro Nagashima, Kawasaki, Japan

[73] Assignee: Fujitsu Limited, Kawasaki, Japan

[21] Appl. No.: 08/925,796

[22] Filed: Sep. 9, 1997

[30] Foreign Application Priority Data

Feb. 14, 1997 [JP] Japan .................................. 9-030917

[51] Int. Cl.⁶ .................................................. H05K 7/20
[52] U.S. Cl. .................................. 62/3.7; 62/296; 62/401; 361/692; 361/695
[58] Field of Search .................................. 62/3.2, 3.7, 3.3, 62/259.2, 401, 86, 404, 296; 361/690, 691, 692, 695

[56] References Cited

U.S. PATENT DOCUMENTS

| | | | |
|---|---|---|---|
| 3,140,928 | 7/1964 | Spalding | 62/86 |
| 3,158,007 | 11/1964 | Kentfield | 62/86 |
| 3,200,607 | 8/1965 | Williams | 62/401 |
| 5,107,398 | 4/1992 | Bailey | 361/384 |
| 5,477,416 | 12/1995 | Schkrohowsky et al. | 361/695 |
| 5,729,995 | 3/1998 | Tajima | 62/259.2 |

FOREIGN PATENT DOCUMENTS

| | | |
|---|---|---|
| 57-181200 | 11/1982 | Japan . |
| 62-51298 | 3/1987 | Japan . |

Primary Examiner—William Doerrler
Attorney, Agent, or Firm—Staas & Halsey

[57] ABSTRACT

The invention provides an air cooling duct and a cooling apparatus which can effect ventilation and cooling with certainty while suppressing noise. The cooling air duct is provided on a wall of a housing, in which a heat source is accommodated, and inducts external air into the housing or vents air in the housing to the outside of the housing in order to cool the inside of the housing. The cooling air duct defines an air path for communicating the inside and the outside of the housing with each other and further defines an expansion chamber formed on the air path. The cooling apparatus includes the cooling air duct. The cooling air duct and the cooling apparatus can be used principally to cool the inside of a housing of an electronic apparatus such as a computer or a communication apparatus.

11 Claims, 13 Drawing Sheets

COOLING AIR DUCT AND COOLING APPARATUS

BACKGROUND OF THE INVENTION

1. Field of the Invention

This invention relates to a cooling air duct and a cooling apparatus for cooling the inside of a housing principally of an electronic apparatus such as a computer or a communication apparatus.

2. Description of the Related Art

In recent years, as development of a computer in terms of the performance and the function proceeds, also the mounting density of printed circuit boards and parts provided in the inside of the computer increases and a rise of the internal temperature by heat generated by the parts increases. In order to cool a computer, a cooling system which employs a fan, that is, an air cooling system, is used principally. Where a fan is used, however, there is a limitation in cooling capacity, and also noise leaking from the inside to the outside of the apparatus makes a problem. Therefore, development of a cooling air duct and a cooling apparatus which have a reliable cooling performance while noise is suppressed is demanded.

Generally in an electronic apparatus such as a computer or a communication apparatus, an air cooling system is applied to cool the inside of a housing. In the air cooling system, principally a fan is used to suck external air into the housing to radiate heat of the inside of the housing. On the other hand, in a large computer or a like apparatus, a water cooling system wherein liquid is circulated in the inside of the apparatus to radiate heat is sometimes applied. However, for computers, an air cooling system which uses a fan is employed principally. It is to be noted that, in the air cooling system, the temperature is adjusted by the number of fans to be used. In particular, where a lower cooling temperature of the inside of the housing is desired, the number of fans to be used is increased.

FIGS. 12 and 13 show a construction of an ordinary computer to which an air cooling system is applied. FIG. 12 is a side elevational sectional view schematically showing an internal construction of the computer, and FIG. 13 is a view as viewed in the direction of an arrow mark XIII of FIG. 12.

Referring first to FIG. 12, a mother board 11, a floppy disk driver (FDD) 12, a CD-ROM (compact disk read only memory) 13, a hard disk apparatus 14, a power supply 15 and other components are provided in a housing 10 of the computer. A CPU (central processing unit) board 16 and various printed circuit boards 17 are mounted on the mother board 11.

In order to cool the inside of the housing 10 in which such various components as mentioned above are built, a plurality of (two in FIG. 12) fans 20 are provided at a front side (right side in FIG. 12) location in the housing 10. Further, a front panel 18 is provided on the front face side (right side of FIG. 12) of the housing 10. The front panel 18 has a plurality of ventilating slits 18a formed therein corresponding to the positions of the fans 20.

When the fans 20 operate, external air flows into the inside of the housing 10 through the ventilating slits 18a of the front panel 18 and cools the inside of the housing 10. The air warmed as a result of the cooling action is discharged to the outside of the housing 10 through a plurality of vent holes (not shown) formed in a rear panel 19 of the housing 10.

A cable 21 is connected to the computer.

In the cooling system described above, however, since the number of fans to be used is increased as a rise of the internal temperature of the computer increases, as the number of fans to be used increases, and also as the number of hard disk apparatus and other apparatus used in the computer increases, the problem of noise which leaks from the inside to the outside of the computer becomes more significant.

Particularly, in the computer shown in FIGS. 12 and 13, the structure for admitting external air into the inside of the housing 10 includes mere perforation of the ventilating slits 18a in the front panel 18, and the structure for discharging air in the housing 10 to the outside includes mere perforation of the vent holes in a metal plate (rear panel 19). Consequently, sound generated in the inside of the housing 10 leaks directly through the structures to the outside. Therefore, it is demanded to decrease noise with certainty.

As described above, with the air cooling system, while the number of fans to be used must be increased as a rise of the internal temperature of the apparatus (housing 10) increases, since the cooling capacity provided by the fans is limited, the internal temperature of the apparatus cannot be adjusted freely. Further, as the number of fans to be used increases, also noise leaking to the outside of the apparatus increases and makes a problem. On the other hand, the water cooling system can be adopted only by large computers and like apparatus and requires a high cost.

Therefore, it is demanded to make it possible to arbitrarily adjust the internal temperature of a housing of a computer or a like apparatus to assure a high cooling capacity without increasing the number of fans to be used while noise is decreased.

SUMMARY OF THE INVENTION

It is an object of the present invention to provide an air cooling duct which can effect ventilation with certainty while suppressing noise.

It is another object of the present invention to provide a cooling apparatus which has a reliable cooling capacity without increasing the number of fans to be used and achieves reduction in noise.

In order to attain the objects described above, according to an aspect of the present invention, there is provided a cooling air duct provided on a wall of a housing, in which a heat source is accommodated, for inducting external air into the housing or venting air in the housing to the outside of the housing in order to cool the inside of the housing, comprising an expansion chamber formed on an air path for communicating the inside and the outside of the housing with each other.

The cooling air duct may include an inner side duct member having a plurality of ventilating inner side slits formed therein in such a manner as to open to the inside of the housing, and an outer side duct member having a plurality of ventilating outer side slits formed therein in such a manner as to open to the outside of the housing, the inner side duct member and the outer side duct member being disposed in a spaced relationship by a fixed distance from each other with the ventilating inner side slits and the ventilating outer side slits positioned alternately such that the air path is formed between the inner side duct member and the outer side duct member and the expansion chamber is formed on the air path. Or, the cooling air duct may further comprise an acoustic member provided in the expansion chamber.

In the cooling air duct, sound is attenuated making use of reflection of acoustic waves or/and a resonance phenomenon in the expansion chamber formed on the air path. Consequently, sound generated in the inside of the housing can be suppressed from leaking to the outside of the housing.

The air path and the expansion chamber can be formed readily between the inner side duct member and the outer side duct member by disposing the inner side duct member having the ventilating inner side slits formed therein and the outer side duct member having the ventilating outer side slits formed therein in a spaced relationship by the fixed distance from each other with the ventilating inner side slits and the ventilating outer side slits positioned alternately.

Where the acoustic member is provided in the expansion chamber, energy of acoustic waves is absorbed by the acoustic member. Consequently, sound generated in the inside of the housing can be suppressed from leaking to the outside of the housing with a higher degree of certainty.

According to another aspect of the present invention, there is provided a cooling apparatus for cooling the inside of a housing in which a heat source is accommodated, comprising a cooling air duct made of a conductive material and provided on a wall of the housing for inducting external air into the inside of the housing, two different semiconductor elements made of different materials and connected to the cooling air duct, and a power supply for supplying current to the two semiconductor elements.

The cooling air duct may have an air path formed therein for communicating the inside and the outside of the housing with each other and further have an expansion chamber formed on the air path therein. The cooling air duct may include an inner side duct member having a plurality of ventilating inner side slits formed therein in such a manner as to open to the inside of the housing, and an outer side duct member having a plurality of ventilating outer side slits formed therein in such a manner as to open to the outside of the housing, the inner side duct member and the outer side duct member being disposed in a spaced relationship by a fixed distance from each other with the ventilating inner side slits and the ventilating outer side slits positioned alternately such that the air path is formed between the inner side duct member and the outer side duct member and the expansion chamber is formed on the air path. Or/and, the cooling air duct may include an acoustic member provided in the expansion chamber.

Or, the cooling apparatus may further comprise a temperature sensor for detecting a temperature of the inside of the housing, and a control circuit for controlling current amounts to be supplied from the power supply to the two semiconductor elements in response to a result of the detection by the temperature sensor.

In the cooling apparatus, if current is supplied from the power supply to the two different semiconductor elements, the cooling air duct itself is cooled by a Peltier effect. Consequently, external air to be admitted into the inside of the housing can be cooled by the cooling air duct.

Where the expansion chamber is formed on the air path of the cooling air duct, sound is attenuated making use of reflection of acoustic waves or/and a resonance phenomenon in the expansion chamber. Consequently, sound generated in the inside of the housing can be suppressed from leaking to the outside of the housing.

The cooling air duct having the air path and the expansion chamber can be formed readily by disposing the inner side duct member having the ventilating inner side slits formed therein and the outer side duct member having the ventilating outer side slits formed therein in a spaced relationship by the fixed distance from each other with the ventilating inner side slits and the ventilating outer side slits positioned alternately.

Where the acoustic member is provided in the expansion chamber, energy of acoustic waves is absorbed by the acoustic member. Consequently, sound generated in the inside of the housing can be suppressed from leaking to the outside of the housing with a higher degree of certainty.

Furthermore, where the current amounts to be supplied to the two semiconductor elements are controlled by the control circuit in response to a result of the detection by the temperature sensor, feedback control can be performed so that the temperature of the inside of the housing may be equal to an aimed temperature.

In summary, with the cooling air duct of the present invention, since sound is attenuated making use of reflection of acoustic waves or/and a resonance phenomenon in the expansion chamber, sound generated in the inside of the housing can be suppressed from leaking to the outside of the housing. Accordingly, the cooling air duct is advantageous in that noise of the entire apparatus of a computer or a like apparatus can be reduced significantly without disturbing exchanging of air (ventilation) between the inside and the outside of the housing.

Meanwhile, with the cooling apparatus of the present invention, since the cooling air duct itself is cooled by a Peltier effect, external air to be admitted into the inside of the housing through the cooling air duct can be cooled by the cooling air duct. Consequently, the cooling apparatus is advantageous in that the limitation of the cooling capacity of the cooling system which only employs a fan is eliminated and a reliable cooling capacity can be obtained without increasing the number of fans to be used and also in that noise of the entire apparatus of a computer or a like apparatus can be reduced significantly.

Where the expansion chamber is formed on the air path of the cooling air duct, sound is attenuated making use of reflection of acoustic waves or/and a resonance phenomenon in the expansion chamber. Consequently, sound generated in the inside of the housing can be suppressed from leaking to the outside of the housing, and noise can be reduced with a higher degree of certainty without disturbing exchanging of air (ventilation) between the inside and the outside of the housing.

Furthermore, where the current amounts to be supplied to the two semiconductor elements are controlled by the control circuit in response to a result of the detection by the temperature sensor, the cooling apparatus is advantageous also in that the temperature of the inside of the housing can be adjusted arbitrarily.

Further objects, features and advantages of the present invention will become apparent from the following detailed description when read in conjunction with the accompanying drawings in which like parts or elements are denoted by like reference characters.

DESCRIPTION OF THE PREFERRED EMBODIMENTS

[A] First Embodiment

Figure 3:
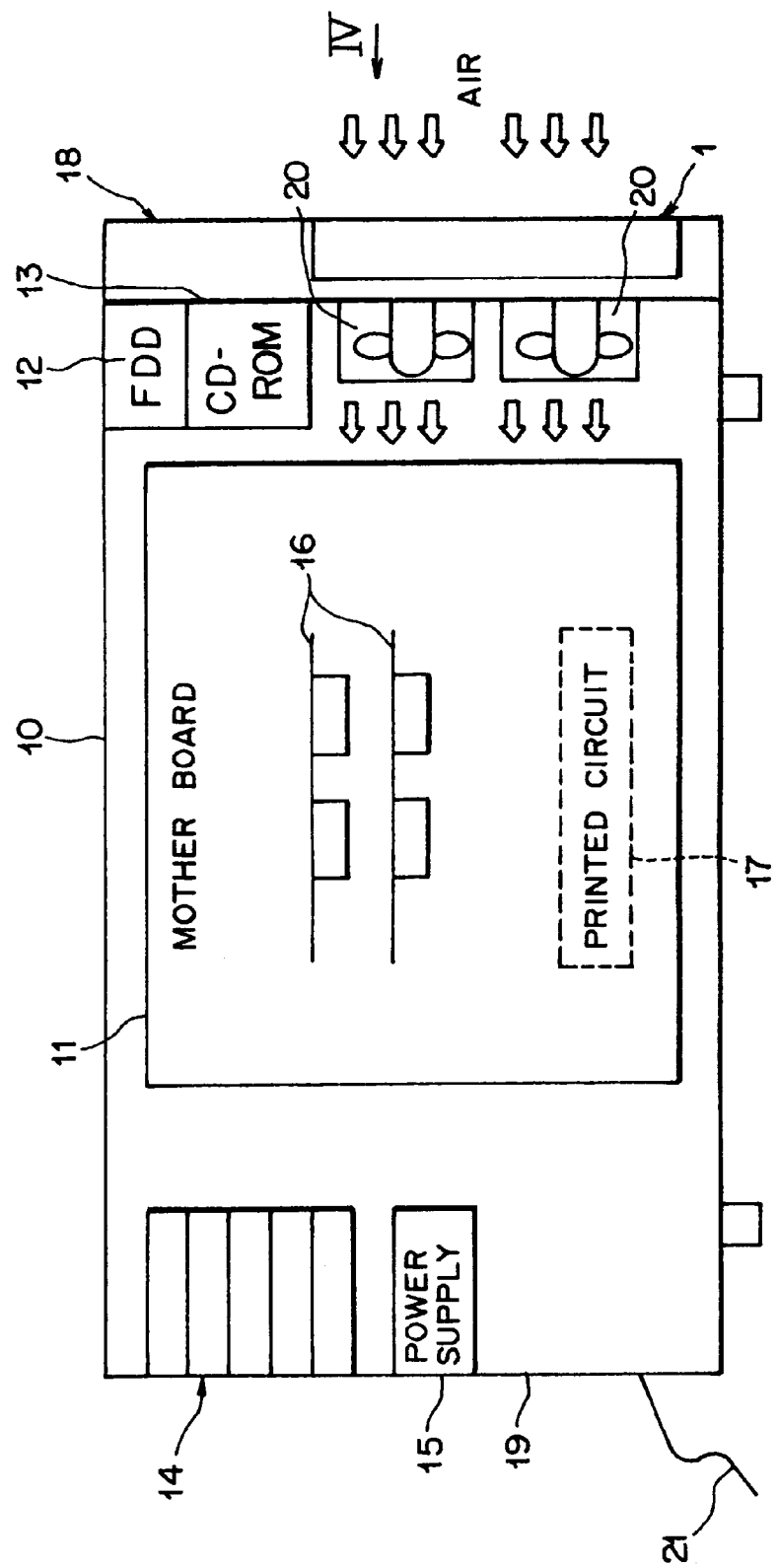
FIG. 3 is a side elevational view schematically showing an internal construction of a computer to which the cooling air duct of FIG. 1 is applied.
Figure 4:
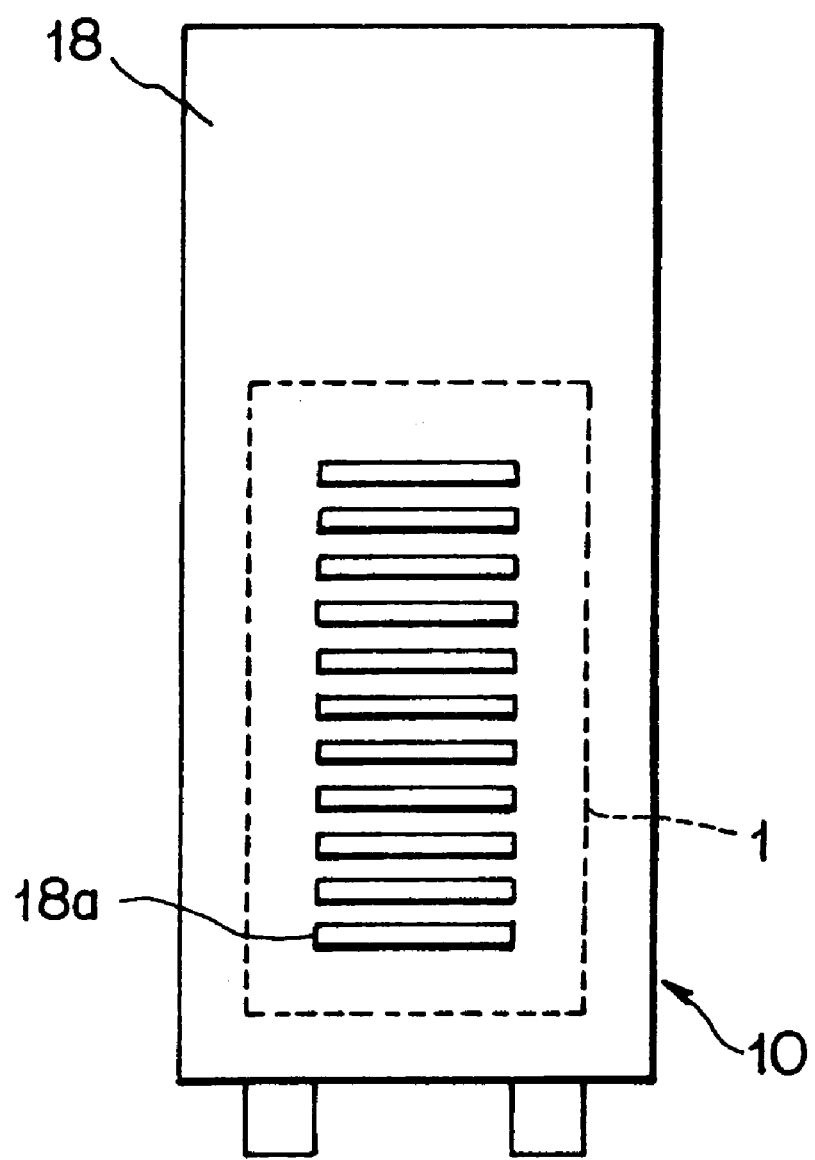
FIG. 4 is a view as viewed in the direction of an arrow mark IV of FIG. 3.
Figure 12:
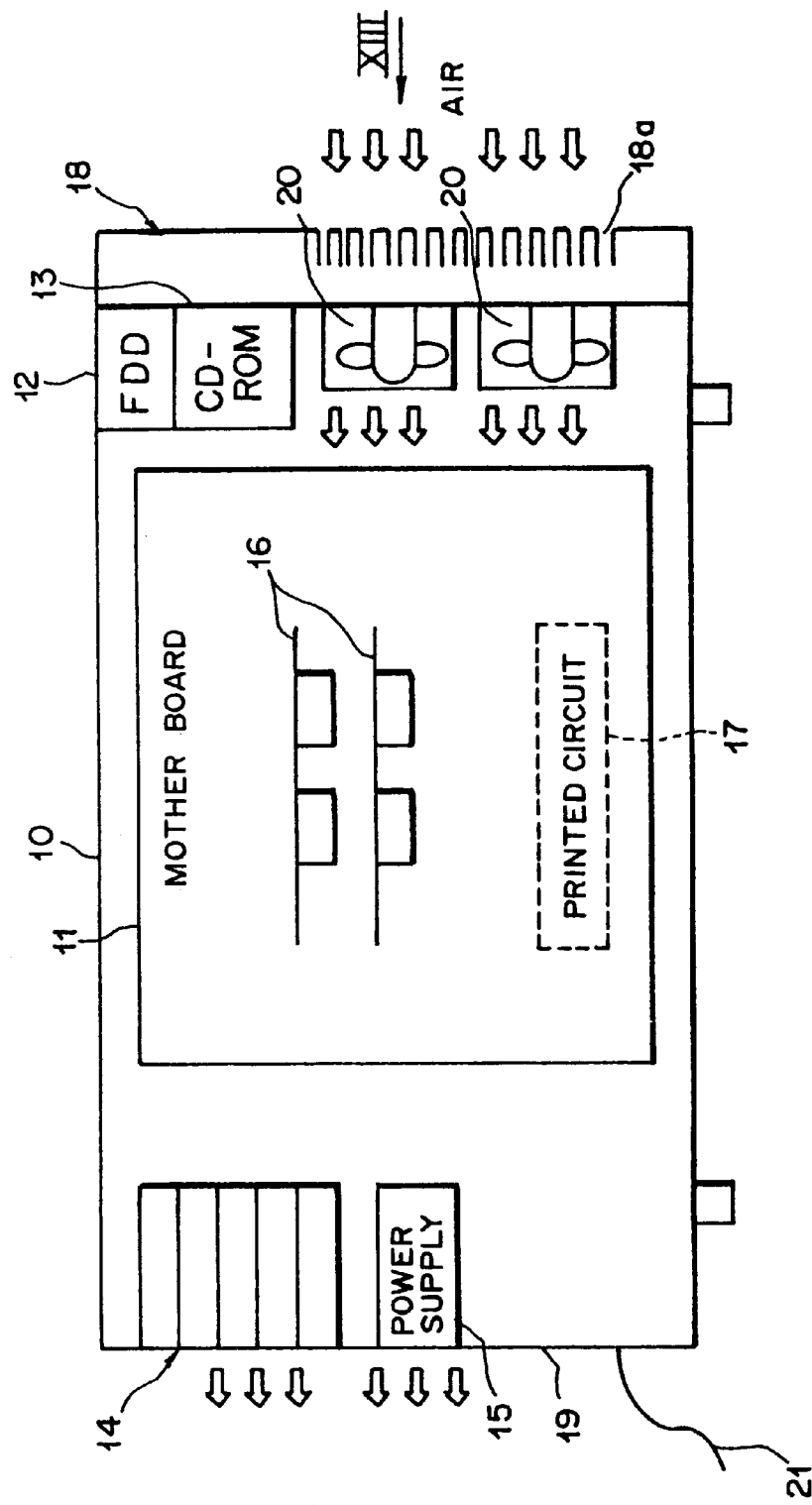
FIG. 12 is a side elevational view schematically showing an internal construction of an ordinary computer to which an air cooling system is applied.
Figure 13:
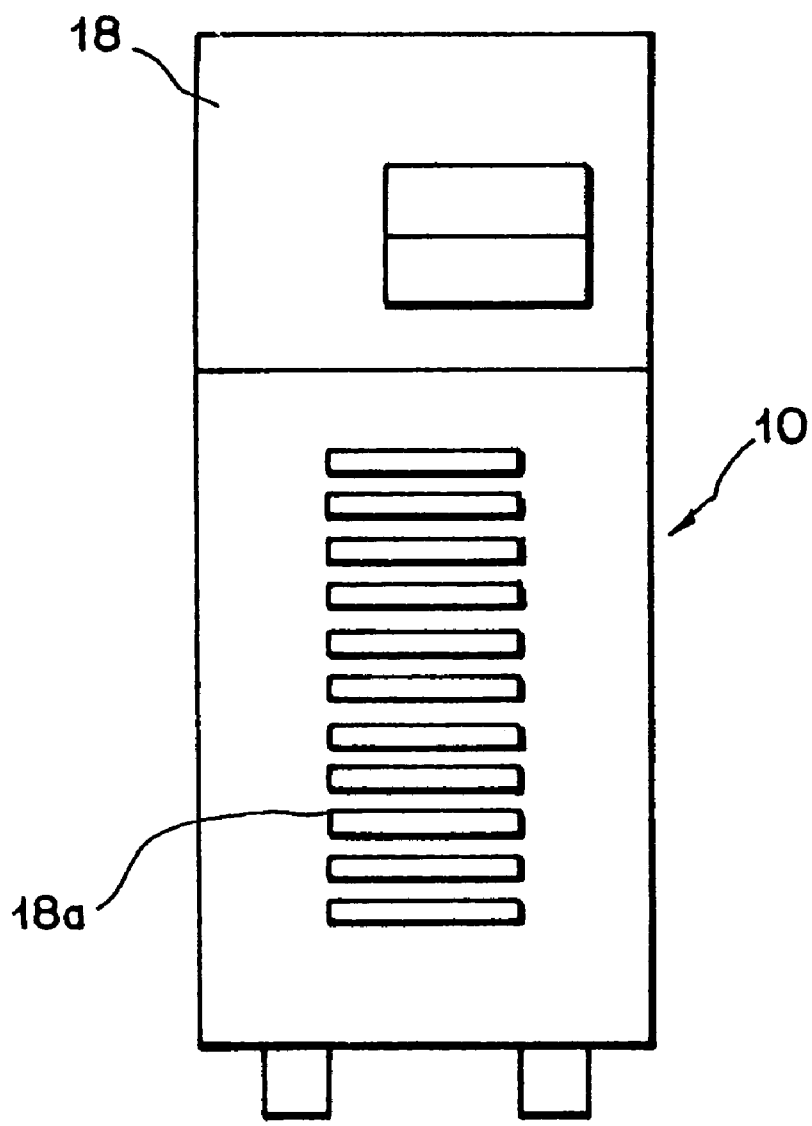
FIG. 13 is a view as viewed in the direction of an arrow mark XIII of FIG. 12.

FIGS. 3 and 4 show a construction of a computer to which a cooling air duct as a first preferred embodiment of the present invention is applied. Referring first to FIG. 3, a housing 10 of the computer of the present embodiment has a mother board 11, a floppy disk driver (FDD) 12, a CD-ROM 13, a hard disk apparatus 14, a power supply 15 and other components provided therein in a similar manner as in the ordinary computer described hereinabove with reference to FIG. 12. A CPU board 16 and various printed circuit boards 17 are mounted on the mother board 11.

In order to cool the inside of the housing 10 in which such components as mentioned above are built in, a plurality of (two in FIG. 3) fans 20 are provided at a front side (right side in FIG. 3) location in the housing 10. Further, a front panel 18 is provided on the front face side (right side in FIG. 3) of the housing 10 as seen in FIGS. 3 and 4. The front panel 18 has a plurality of ventilating slits 18a formed therein in an opposing relationship to the positions of the fans 20. A cable 21 is connected to the computer.

A cooling air duct 1 for admitting external air into the housing 10 to cool the inside of the housing 10 is provided between the fans 20 and the front panel (wall) 18. A detailed construction of the cooling air duct 1 is described below with reference to FIGS. 1 and 2.

Figure 1:
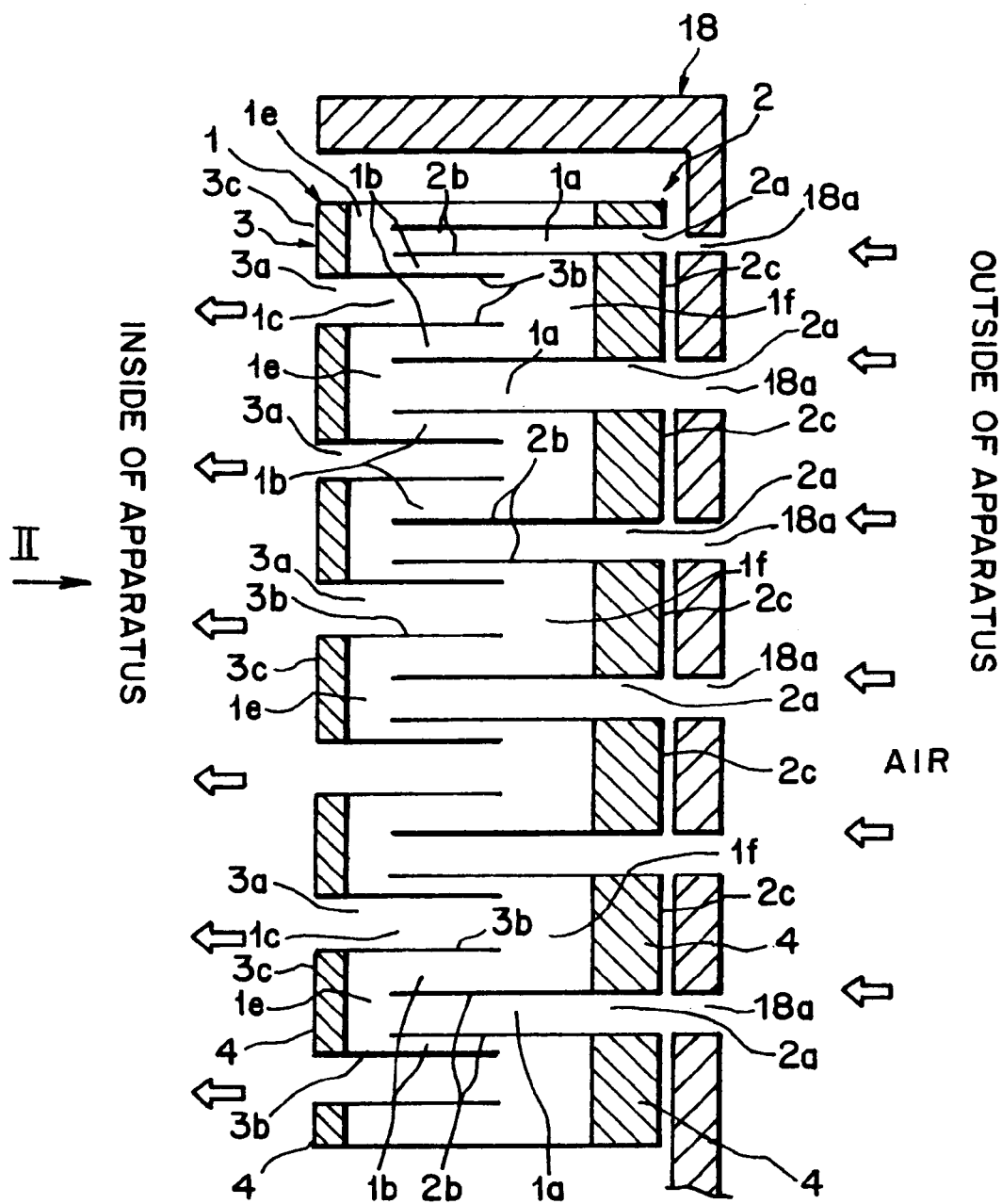
FIG. 1 is a sectional view of a cooling air duct showing a first preferred embodiment of the present invention and taken along line I—I of FIG. 2.
Figure 2:
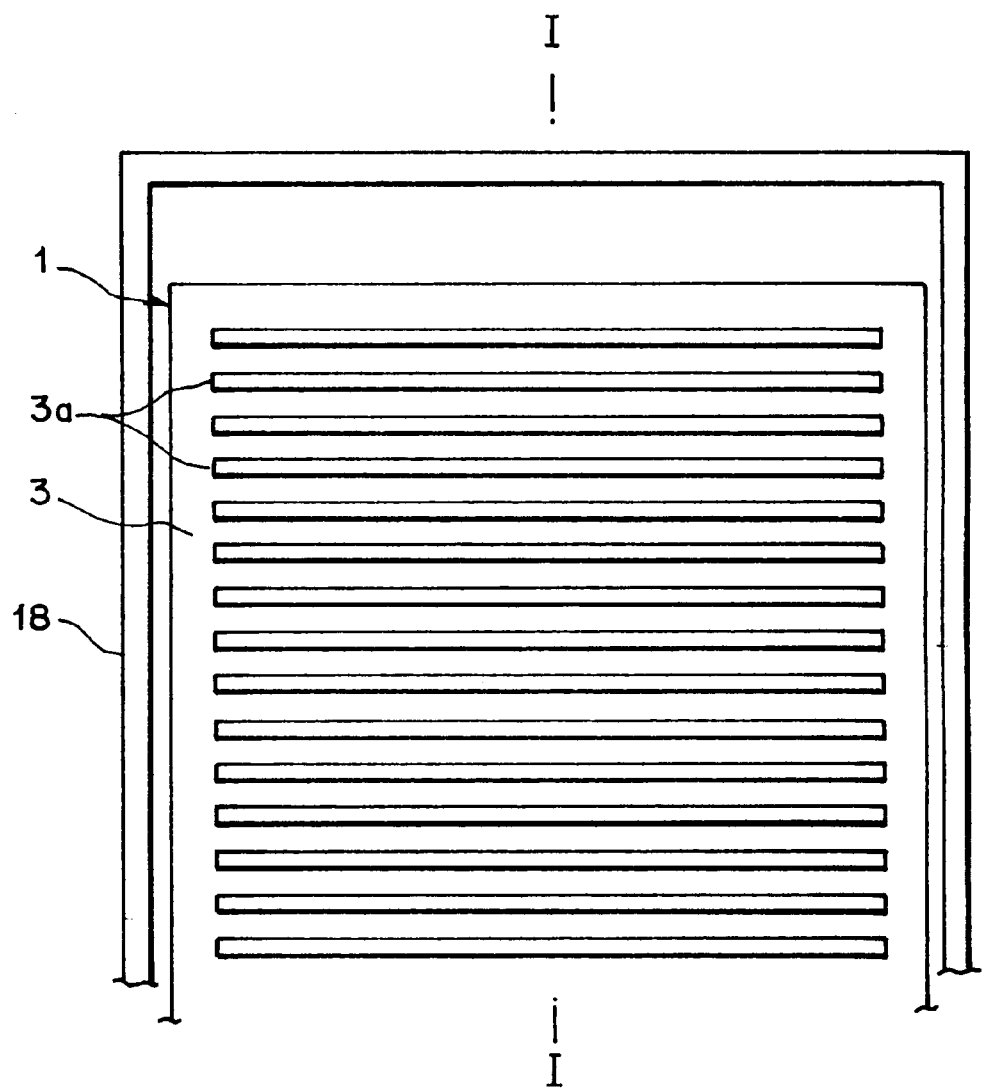
FIG. 2 is a view as viewed in the direction of an arrow mark II of FIG. 1.

The cooling air duct 1 of the present embodiment is formed in such a manner as seen in FIGS. 1 and 2 from an acoustic material. The cooling air duct 1 has air paths 1a, 1b and 1c formed therein for communicating the inside and the outside of the housing 10 with each other and further has expansion chambers 1e and 1f formed on the air paths 1a, 1b and 1c therein. Acoustic members 4 of glass wool or the like are provided in the expansion chambers 1e and 1f.

More particularly, the cooling air duct 1 includes an outer side duct member 2 having a plurality of ventilating outer side slits 2a formed therein such that they are opened to the outside of the housing 10, and an inner side duct member 3 coupled to the outer side duct member 2 and having a plurality of ventilating inner side slits 3a formed therein such that they are opened to the inside of the housing 10. The members 2 and 3 are formed from an acoustic material.

The members 2 and 3 are disposed in a spaced relationship by a fixed distance from each other with the ventilating outer side slits 2a and the ventilating inner side slits 3a positioned alternately such that the air paths 1a, 1b and 1c are formed between the members 2 and 3 and also the expansion chambers 1e and 1f are formed.

In particular, on each of the outer side duct member 2 and the inner side duct member 3, a pair of horizontal plate portions 2b or 3b are formed above and below each of the slits 2a or 3a such that they extend inwardly of the cooling air duct 1 from a vertical plate portion 2c or 3c. And, the outer side duct member 2 and inner side duct member 3 are disposed with the horizontal plate portions 2b and 3b thereof extended parallel to each other therefrom in a vertically overlapping relationship such that the vertical plate portion 2c of the outer side duct member 2 may cover the ventilating inner side slits 3a of the inner side duct member 3 and the vertical plate portion 3c of the inner side duct member 3 may cover the ventilating outer side slits 2a of the outer side duct member 2.

Consequently, in the outer side duct member 2, the air paths 1a which individually communicate with the slits 2a are formed each between a pair of upper and lower ones of the horizontal plate portions 2b, and also in the inner side duct member 3, the air paths 1c which individually communicate with the ventilating inner side slits 3a are formed each between a pair of upper and lower ones of the horizontal plate portions 3b. Further, between the horizontal plate portions 2b of the outer side duct member 2 and the horizontal plate portions 3b of the inner side duct member 3, the air paths 1b which connect the air paths 1a and 1c to each other for communication therebetween are formed. Further, in the outer side duct member 2, the expansion chambers 1f are formed in spaces each defined by a pair of upper and lower ones of the horizontal plate portions 2b and the vertical plate portion 2c. The expansion chambers 1f function also as air paths for connecting the air paths 1b and 1c for communication therebetween. Similarly, in the inner side duct member 3, the expansion chambers 1e are formed in spaces each defined by a pair of upper and lower ones of the horizontal plate portions 3b and the vertical plate portion 3c. The expansion chambers 1e function also as air paths for connecting the air paths 1a and 1b for communication therebetween.

Here, it is tried to trace the air paths 1a to 1c from the outer side to the inner side of the housing 10 in the cooling air duct 1. Each of the slits 2a of the outer side duct member 2 is communicated with a corresponding one of the air paths 1a in the outer side duct member 2. The air path 1a is communicated through a corresponding one of the expansion chambers 1e on the inner side duct member 3 side with a pair of ones of the air paths 1b formed between the inner side duct member 3 and the outer side duct member 2. Each of the two air paths 1b is communicated with a corresponding one of the air paths 1c in the inner side duct member 3 through a corresponding one of the expansion chambers 1f on the outer side duct member 2 side. The air path 1c is communicated with a corresponding one of the slits 3a of the inner side duct member 3 and hence with the inside of the housing 10 through the slit 3a.

The cooling air duct 1 formed in this manner is mounted on the inner side of the front panel 18 such that the ventilating outer side slits 2a of the outer side duct member 2 are registered with the positions of the ventilating slits 18a of the front panel 18.

Figure 5:
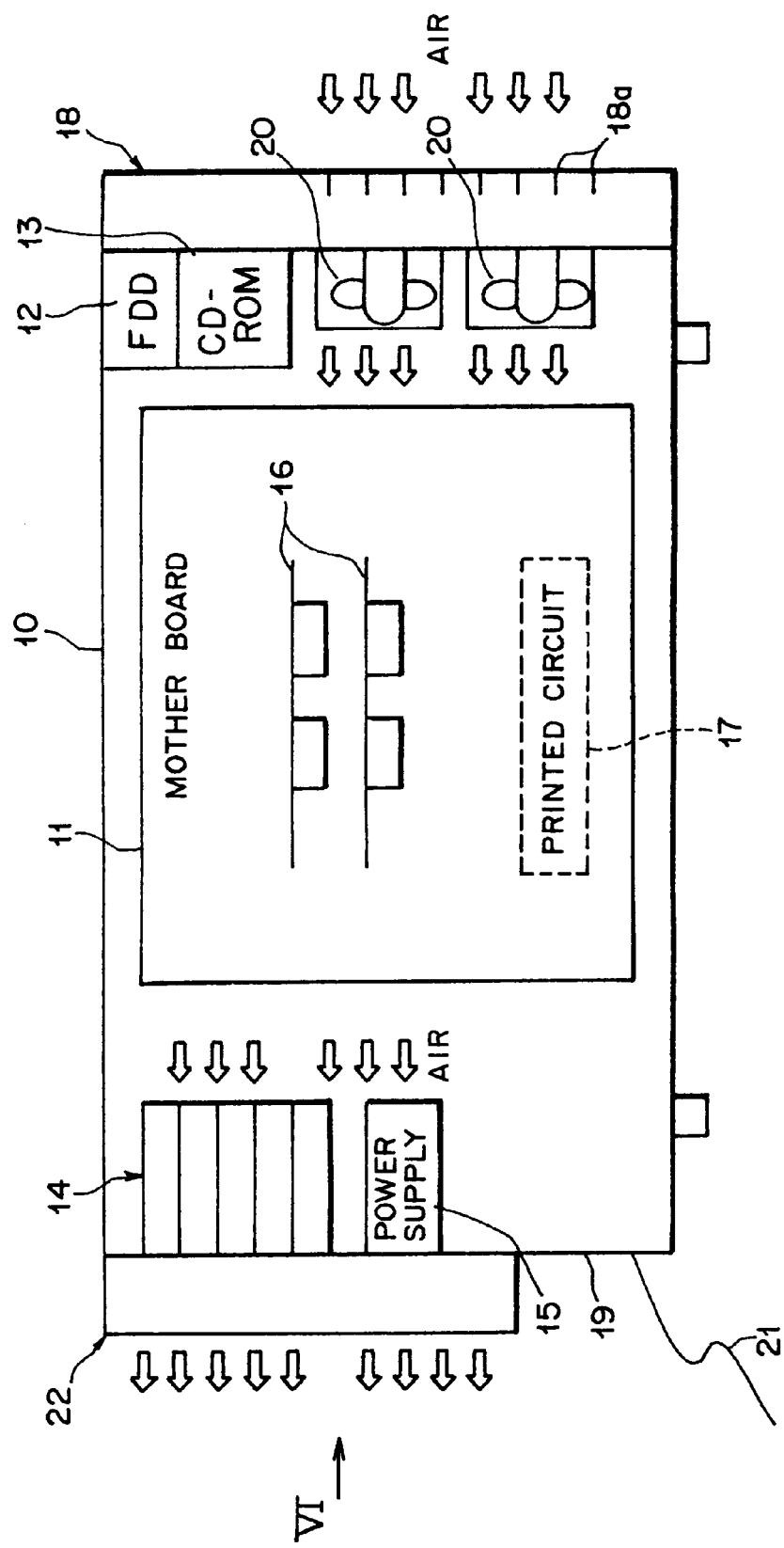
FIG. 5 is a side elevational sectional view schematically showing an internal construction of a modified computer to which the cooling air duct of FIG. 1 is applied.
Figure 6:
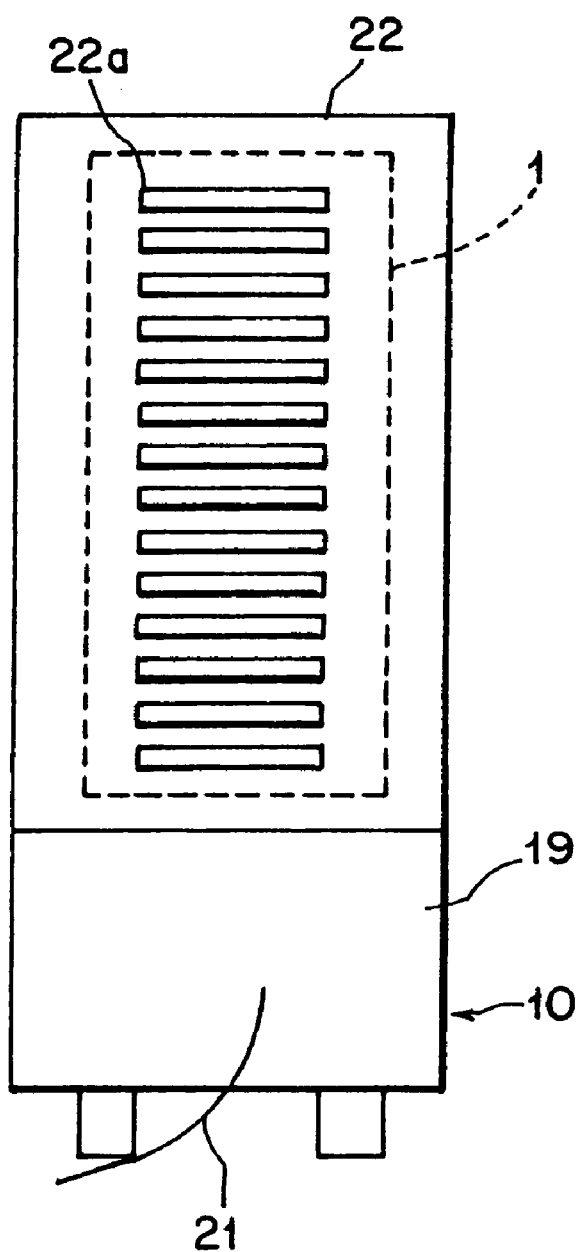
FIG. 6 is a view as viewed in the direction of an arrow mark VI of FIG. 5.

By the way, while, in the arrangement shown in FIGS. 1 to 4, the cooling air duct 1 of the present embodiment is provided on the front face side of the housing 10 of the computer, the cooling air duct 1 may otherwise be provided on the rear face side of the housing 10 in a similar manner. FIGS. 5 and 6 show the modified arrangement. Particularly, FIG. 5 schematically shows an internal construction of the computer which includes the cooling air duct 1 provided on the rear face side thereof.

Referring to FIGS. 5 and 6, the computer shown includes a rear cover 22 on which the cooling air duct 1 (refer to FIG. 1) having the same construction as that described above is provided. The rear cover 22 is mounted on the rear panel 19 of the housing 10. The rear cover 22 has a plurality of ventilating slits 22a formed therein, and the cooling air duct 1 is mounted on the inner side of the rear cover 22 such that the ventilating outer side slits 2a of the outer side duct member 2 are individually registered with the positions of the ventilating slits 22a of the rear cover 22. In this instance, however, the cooling air duct 1 functions so as to discharge air in the housing 10 to the outside therethrough.

In the computer having the construction described above with reference to FIGS. 1 to 4, when the fans 20 operate, external air is admitted into the inside of the housing 10 through the ventilating slits 18a of the front panel 18 and the cooling air duct 1 and cools the inside of the housing 10. Then, the air warmed as a result of its cooling action is discharged to the outside of the housing 10 through the vent holes (not shown) formed in the rear panel 19 of the housing 10.

On the other hand, in the computer shown in FIGS. 5 and 6, when the fans 20 operate, external air is admitted into the inside of the housing 10 through the ventilating slits 18a of the front panel 18 and cools the inside of the housing 10. Then, the air warmed as a result of its cooling action is discharged to the outside of the housing 10 through the cooling air duct 1 and the ventilating slits 22a of the rear cover 22.

Since the cooling air duct 1 is mounted on at least one of the front face portion and the rear face portion of the housing 10 such that the outside and the inside of the housing 10 are communicated with each other by the cooling air duct 1 in this manner, sound is attenuated making use of reflection of acoustic waves, a resonance phenomenon and so forth in the expansion chambers 1e and 1f formed on the air paths 1a to 1c in the cooling air duct 1, and consequently, sound generated in the inside of the housing 10 can be suppressed from leaking to the outside. Further, since the acoustic members 4 are provided in the expansion chambers 1e and 1f, energy of acoustic waves is absorbed by the acoustic members 4, and consequently, sound generated in the inside of the housing 10 can be suppressed from leaking to the outside of the housing 10 with a higher degree of certainty.

Further, in the computer in the present embodiment, since the outer side duct member 2 and the inner side duct member 3 are disposed in a spaced relationship by a fixed distance from each other and the ventilating outer side slits 2a and the ventilating inner side slits 3a are located alternately, the air paths 1a to 1c and the expansion chambers 1e and 1f can be formed readily between the outer side duct member 2 and the inner side duct member 3.

Accordingly, with the air cooling duct of the first embodiment of the present invention, noise of the entire computer to which the air cooling duct is applied can be reduced significantly without disturbing exchanging of air (ventilation) between the inside and the outside of the housing 10.

It is to be noted that, while such an effect as described above can be achieved if the cooling air duct 1 of the present embodiment is mounted on only one of the front face portion and the rear face portion of the housing 10, where the cooling air duct 1 is mounted on both of the front face portion and the rear face portion of the housing 10, a higher noise reduction effect can be achieved.

B. Second Embodiment

Figure 7:
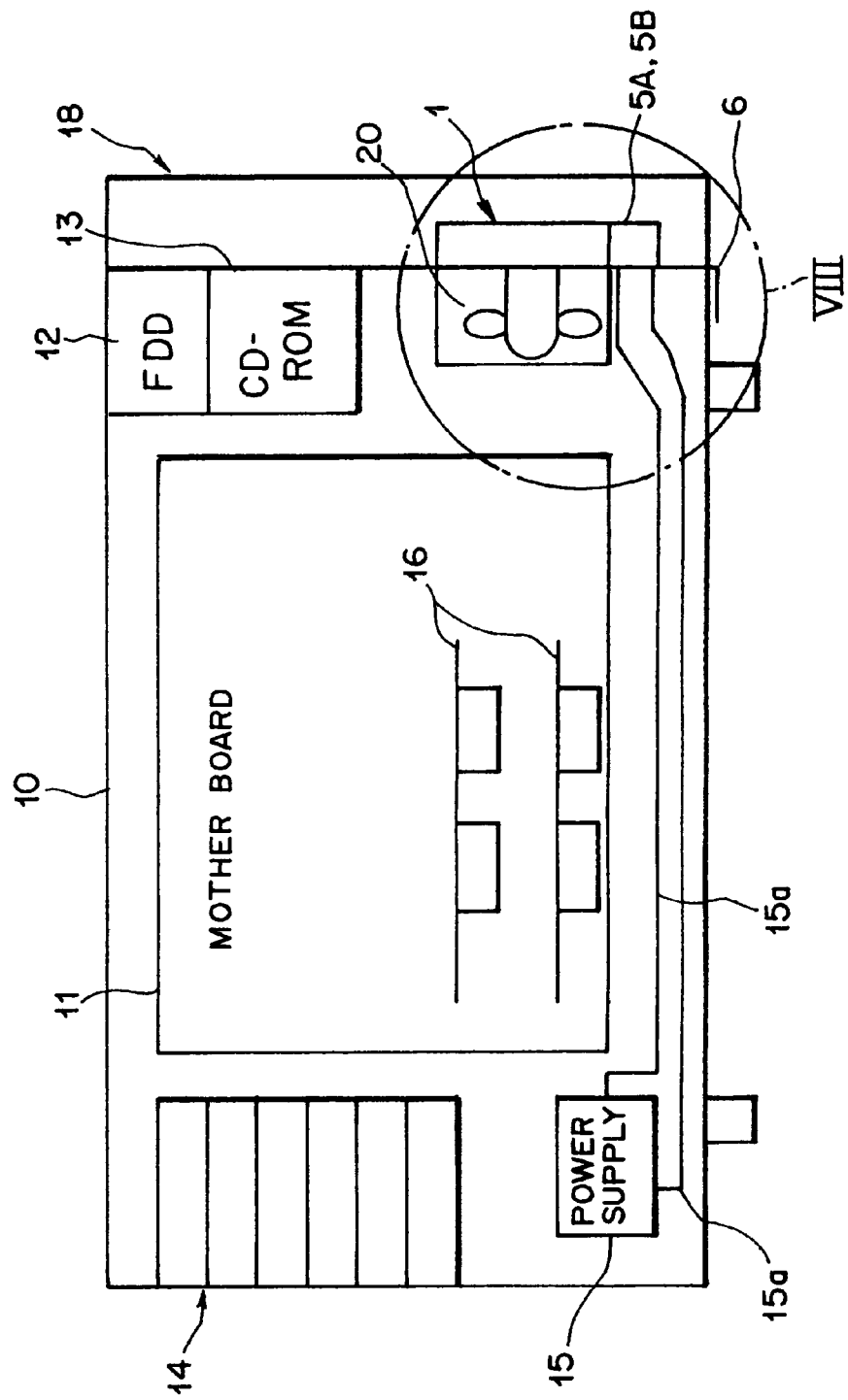
FIG. 7 is a side elevational view schematically showing an internal construction of a computer to which a cooling apparatus as a second preferred embodiment of the present invention is applied.

A second embodiment of the present invention is described below with reference to FIGS. 7 to 10. Also a computer in the second embodiment is constructed in a similar manner to that in the first embodiment shown in FIG. 3. However, as seen in FIG. 7, the computer in the second embodiment includes a single fan 20, and a cooling cooling air duct 1 is interposed between the fan 20 and a front panel (wall) 18 of a housing 10 for admitting external air into the inside of the housing 10 therethrough in order to cool the inside of the housing 10. In the present embodiment, an air duct made of a conductive material such as a copper plate is used for the cooling air duct 1.

Figure 8:
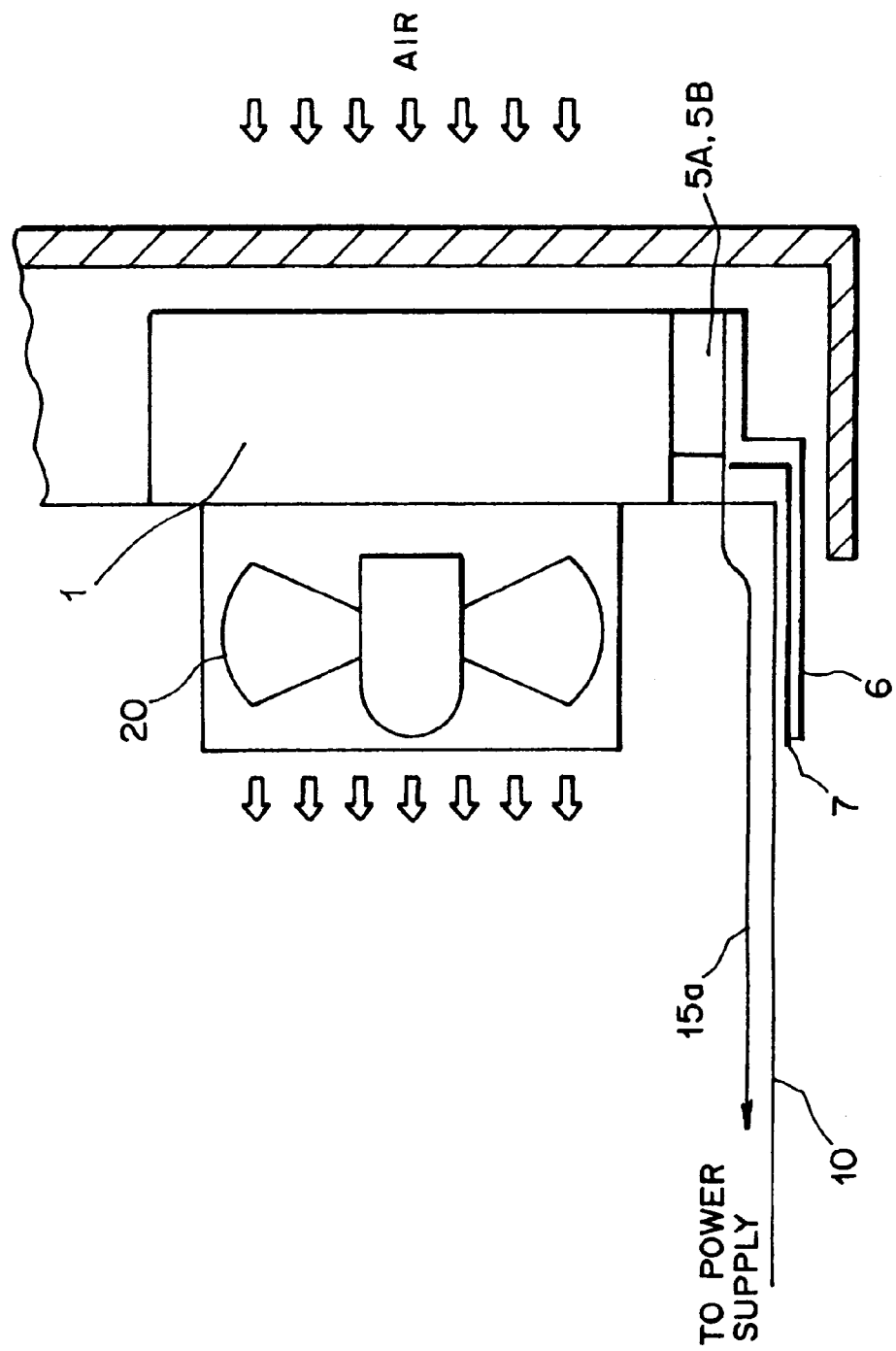
FIG. 8 is a sectional view showing, in an enlarged scale, a portion denoted at VIII in FIG. 7.
Figure 9:
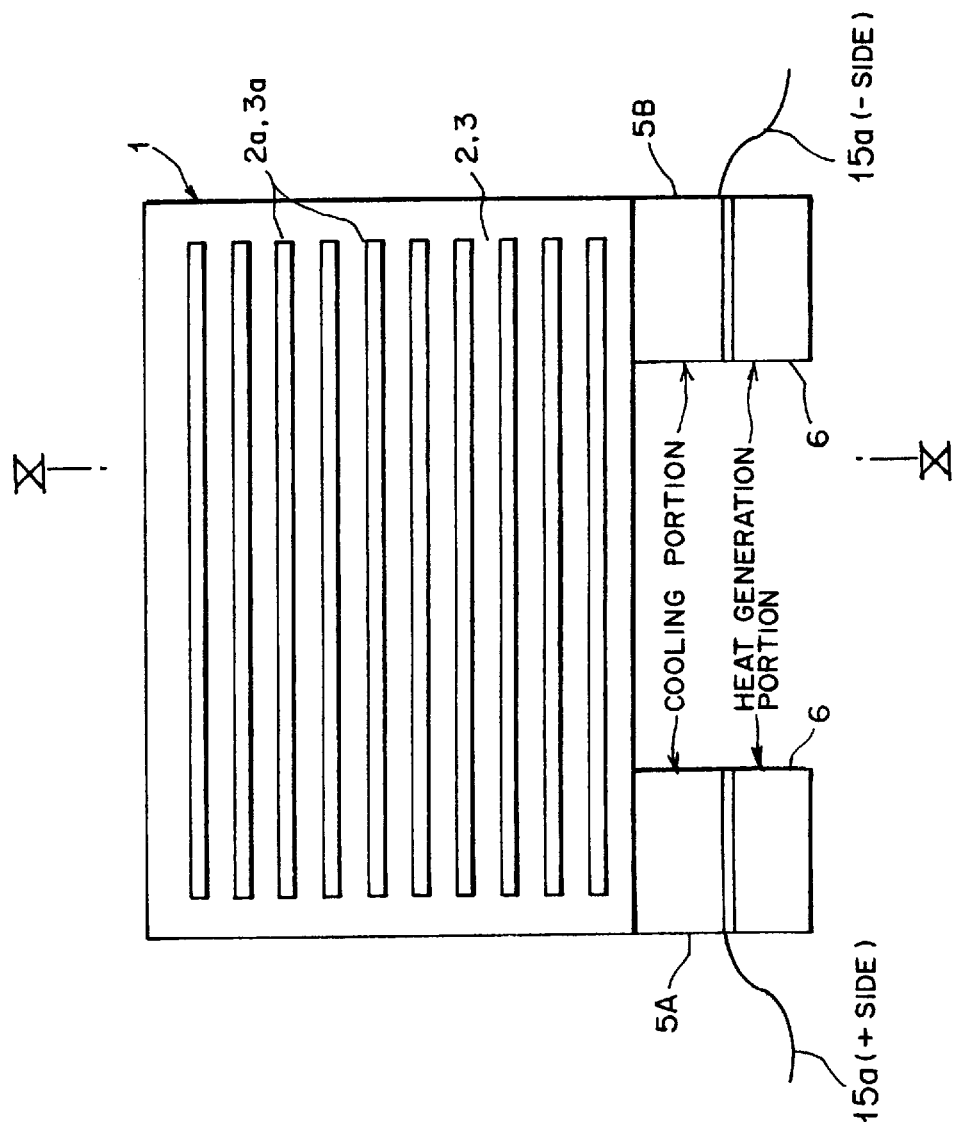
FIG. 9 is a front elevational view showing a cooling air duct of the cooling apparatus shown in FIG. 7.

As seen from FIGS. 7 to 9, two semiconductor elements made of different materials, that is, a P-type semiconductor element (or N-type semiconductor) 5A and an N-type semiconductor element (or P-type semiconductor) 5B are connected to the opposite sides of a lower portion of the cooling air duct 1. Current is supplied from a power supply 15 to the semiconductor elements 5A and 5B through a pair of current wires 15a.

Figure 10:
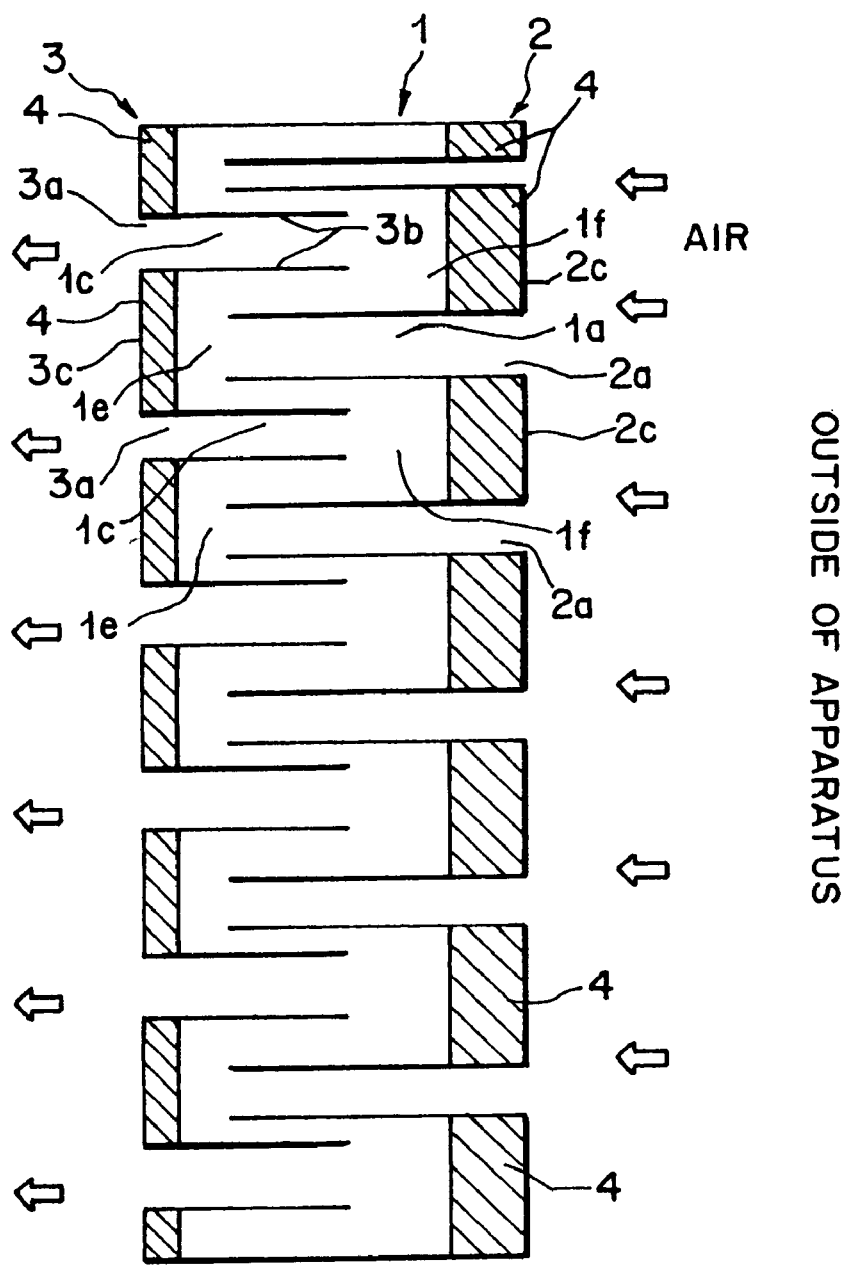
FIG. 10 is a sectional view taken along line X—X of FIG. 9.

The cooling air duct 1 has a construction similar to that of the first embodiment and is formed in such a manner as seen in FIG. 10 from an acoustic material. The cooling air duct 1 has air paths 1a, 1b and 1c formed therein such that they communicate the inside and the outside of the housing 10 with each other, and further has expansion chambers 1e and 1f formed on the air paths 1a, 1b and 1c therein. A sound absorbing material 4 of glass wool or the like is provided in each of the expansion chambers 1e and 1f. It is to be noted that description of a detailed construction of the cooling air duct 1 is omitted herein to avoid redundancy since it is quite same as that described hereinabove with reference to FIGS. 1 and 2.

Further, a heat radiation plate 6 made of a metal is mounted on a lower face of each of the semiconductor elements 5A and 5B connected to the cooling air duct 1. The heat radiation plates 6 extend from the semiconductor elements 5A and 5B to a lower face of the housing 10 as seen in FIGS. 7 and 8. Furthermore, a heat insulator 7 is provided on a face of each of the heat radiation plates 6 adjacent the housing 10 so that heat may not be radiated to the housing 10.

In the computer having the construction described above, by supplying current from the power supply 15 to the two different semiconductor elements 5A and 5B via the current wires 15a, the cooling air duct 1 itself is cooled by a Peltier effect. In particular, cooling portions of the semiconductor element 5A and 5B are held in contact with the outer side duct member 2 and the inner side duct member 3, and consequently, the entire cooling air duct 1 is cooled from the cooling portions. Further, heat generated upon such cooling is transmitted from heat generation portions of the semiconductor elements 5A and 5B to the heat radiation plates 6 and then radiated from the heat radiation plates 6 to external air.

Accordingly, when the fan 20 operates, external air is admitted into the inside of the housing 10 through the ventilating slits 18a of the front panel 18 and the cooling air duct 1, and thereupon, the external air to flow into the housing 10 through the cooling air duct 1 can be cooled by the cooling air duct 1. In particular, since a temperature difference can be provided between the external air and the air admitted into the housing 10, the cooling efficiency is improved. The air cooled by the cooling air duct 1 and admitted into the housing 10 is circulated in the housing 10 and cools the inside of the housing 10. Thereafter, it is discharged to the outside of the housing 10 through the plurality of vent holes (not shown) formed in the rear panel 19 of the housing 10.

Also in the cooling air duct 1 of the second embodiment, since sound is attenuated making use of reflection of acoustic waves or a resonance phenomenon in the expansion chambers 1e and 1f formed on the air paths 1a to 1c in the cooling air duct 1, sound generated in the inside of the housing 10 can be suppressed from leaking to the outside of the housing 10. In this instance, where the cooling air duct 1 has such a structure as shown in FIG. 10, a large area can be assured for the cooling air duct 1 which contacts with external air before the external air comes to the inside of the housing 10. Consequently, the cooling efficiency of the external air can be raised significantly.

Further, since the acoustic members 4 are provided in the expansion chambers 1e and 1f, energy of acoustic waves is absorbed by the acoustic members 4, and consequently, sound generated in the inside of the housing 10 can be suppressed from leaking to the outside of the housing 10 with a higher degree of certainty.

Further, also in the second embodiment, where the outer side duct member 2 and the inner side duct member 3 are provided in a spaced relationship by a fixed distance from each other and the ventilating outer side slits 2a and the ventilating inner side slits 3a are positioned in an alternate relationship to each other, the air paths 1a to 1c and the expansion chambers 1e and 1f can be formed readily between the outer side duct member 2 and the inner side duct member 3.

In this manner, with the cooling air duct of the second embodiment of the present invention, the limitation in cooling capacity of the cooling system which only employs the fan 20 is eliminated, and a reliable cooling capacity can be obtained without increasing the number of fans to be used and a temperature rise in the inside of the computer which may be caused by an increase in mounting density of parts can be suppressed with certainty. Simultaneously, where the cooling air duct 1 described above is used, sound generated in the inside of the housing 10 can be suppressed from leaking to the outside of the housing 10. Consequently, noise of the entire computer can be reduced significantly without disturbing exchanging of air (ventilation) between the inside and the outside of the housing 10.

Figure 11:
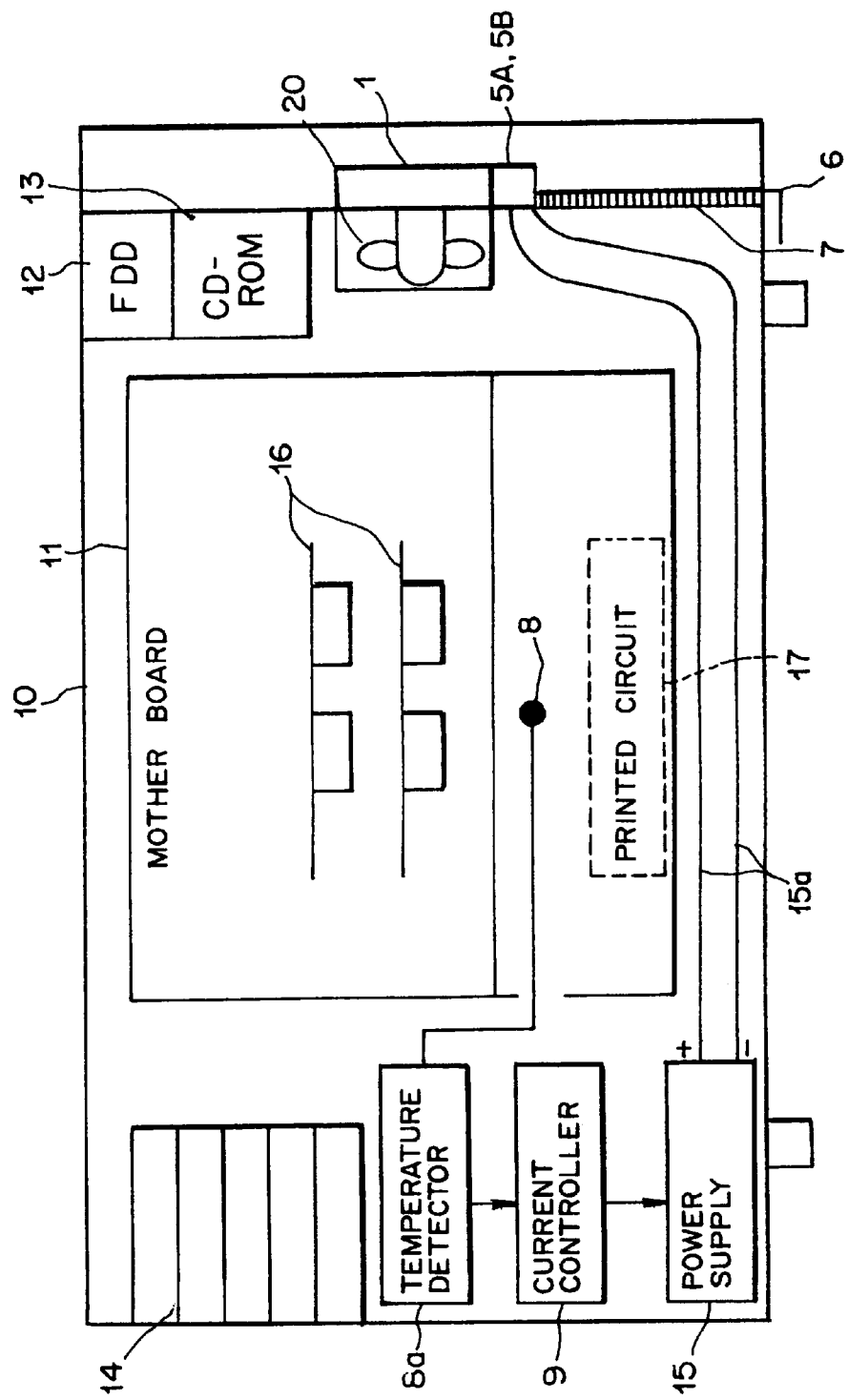
FIG. 11 is a side elevational sectional view schematically showing an internal construction of a modified computer to which the cooling apparatus as the second embodiment of the present invention is applied.

By the way, FIG. 11 schematically shows an internal construction of another computer to which the cooling apparatus as the second embodiment of the present invention is applied. The computer shown in FIG. 11 includes, in addition to the components of the computer shown in FIG. 7, a temperature sensor 8 and a temperature detector 8a for detecting the temperature of the inside of the housing 10, and a current controller (control circuit) 9 for controlling current amounts to be supplied to the two different semiconductor elements 5A and 5B from the power supply 15 through the current wires 15a in response to the temperature sensor 8 and the temperature detector 8a. It is to be noted that the temperature sensor 8 is, for example, a device such as, for example, a thermocouple, and the temperature detector 8a converts a detection signal from the temperature sensor 8 into a suitable electric signal and outputs the electric signal to the current controller 9.

In the computer having such a construction as described above, by controlling the current amounts to be supplied to the two different semiconductor elements 5A and 5B by means of the current controller 9 in response to a result of detection by the temperature sensor 8, feedback control can be performed so that the temperature of the inside of the housing 10 may become equal to an arbitrary aimed temperature. In short, the internal temperature of the housing 10 can be adjusted arbitrarily.

In this instance, the speed of rotation of the fan 20 may be fixed while the current amounts to be supplied to the two different semiconductor elements 5A and 5B are controlled by the current controller 9 to control only the temperature of the cooling air duct 1. However, if also the speed of rotation of the fan 20 is controlled in response a result of detection by the temperature sensor 8, then the controlling efficiency to an aimed temperature can be further improved.

It is to be noted that, if the computer in the second embodiment described above includes the cooling air duct 1 mounted on the rear face portion of the housing 10 as described above with reference to FIGS. 5 and 6, a higher noise reduction effect can be achieved.

[C] Others

While, in the embodiments described above, a housing in which a heat source is accommodated is a computer and which makes an object of cooling is a computer, the present invention is not limited to this and can be applied also to various other electronic apparatus such as a communication apparatus similarly while achieving similar effects to those of the embodiments described above.

The present invention is not limited to the specifically described embodiment, and variations and modifications may be made without departing from the scope of the present invention.

What is claimed is:

1. A cooling air duct provided on a wall of a housing, in which a heat source is disposed for inducting external air into said housing or venting air in said housing to outside said housing in order to cool inside said housing, said cooling air duct comprising:

an expansion chamber formed on an air path for communicating the inside and the outside of said housing with each other; and an inner side duct member having a plurality of ventilating inner side slits formed therein in such a manner as to open to the inside of said housing, and an outer side duct member having a plurality of ventilating outer side slits formed therein in such a manner as to open to the outside of said housing, said inner side duct member and said outer side duct member being disposed in a spaced relationship with said ventilating inner side slits and said ventilating outer side slits positioned alternately such that said air path is formed between said inner side duct member and said outer side duct member and said expansion chamber is formed on said air path.

2. A cooling air duct as claimed in claim 1, further comprising an acoustic member provided in said expansion chamber.

3. A cooling apparatus for cooling inside of a housing in which a heat source is disposed, said cooling apparatus comprising:

a cooling air duct made of a conductive material and provided on a wall of said housing for inducting external air into the inside of said housing;

two different semiconductor elements made of different materials and connected to said cooling air duct;

a power supply for supplying current to said two semiconductor elements, wherein said cooling air duct has an air path formed therein for communicating the inside and outside of said housing with each other and further has an expansion chamber formed on said air path therein, and said cooling air duct includes an inner side duct member having a plurality of ventilating inner side slits formed therein in such a manner as to open to the inside of said housing, and an outer side duct member having a plurality of ventilating outer side slits formed therein in such a manner as to open to the outside of said housing, said inner side duct member and said outer side duct member being disposed in a spaced relationship with said ventilating inner side slits and said ventilating outer side slits positioned alternately such that said air path is formed between said inner side duct member and said outer side duct member and said expansion chamber is formed on said air path.

4. A cooling apparatus for cooling inside of a housing in which a heat source is disposed, said cooling apparatus comprising:

a cooling air duct made of a conductive material and provided on a wall of said housing for inducting external air into the inside of said housing;

two different semiconductor elements made of different materials and connected to said cooling air duct;

a power supply for supplying current to said two semiconductor elements, wherein said cooling air duct has an air path formed therein for communicating the inside and the outside of said housing with each other and further has an expansion chamber formed on said air path therein; and said cooling air duct includes an acoustic member provided in said expansion chamber.

5. A cooling apparatus as claimed in claim 3, wherein said cooling air duct includes an acoustic member provided in said expansion chamber.

6. A cooling apparatus as claimed in claim 3, further comprising:

a temperature sensor for detecting a temperature of the inside of said housing; and a control circuit for controlling current amounts to be supplied from said power supply to said two semiconductor elements in response to a result of the detection by said temperature sensor.

7. A cooling apparatus as claimed in claim 4, further comprising:

a temperature sensor for detecting a temperature of the inside of said housing; and a control circuit for controlling current amounts to be supplied from said power supply to said two semiconductor elements in response to a result of the detection by said temperature sensor.

8. A cooling apparatus as claimed in claim 5, further comprising:

a temperature sensor for detecting a temperature of the inside of said housing; and a control circuit for controlling current amounts to be supplied from said power supply to said two semiconductor elements in response to a result of the detection by said temperature sensor.

9. A cooling air duct as claimed in claim 1, wherein said inner side duct member and said outer side duct member are disposed in a spaced relationship by a fixed distance from each other.

10. A cooling apparatus as claimed in claim 3, wherein said inner side duct member and said outer side duct member are disposed in a spaced relationship by a fixed distance from each other.

11. A cooling air duct comprising:

means for attaching said cooling air duct to a wall of a housing in which a heat source is disposed;

means for communicating said housing with outside said housing;

a first means for opening to the inside of said housing;

a second means for opening to the outside of said housing;

wherein said first means and said second means are disposed so as to be interspersed with one another, such that an air path is formed between said first means and said second means, with said communicating means being formed along said path.

* * * * *